United States Patent [19]

Kourimsky et al.

[11] 4,175,818

[45] Nov. 27, 1979

[54] ELECTRICAL CONNECTORS

[75] Inventors: Friedrich J. A. Kourimsky, Benshiem; Heinrich John, Rodgau, both of Fed. Rep. of Germany

[73] Assignee: AMP Incorporated, Harrisburg, Pa.

[21] Appl. No.: 911,723

[22] Filed: Jun. 1, 1978

[30] Foreign Application Priority Data

Jun. 3, 1977 [GB] United Kingdom ............... 23624/77

[51] Int. Cl.$^{2}$ ......................... H05K 1/07; H01R 13/42

[52] U.S. Cl. ............................ 339/176 MP; 339/208; 339/217 S

[58] Field of Search .............. 339/17 L, 75 MP, 97 R, 339/97 P, 98, 99 R, 176 MP, 198 H, 206 R, 210 R, 210 M, 208

[56] References Cited

U.S. PATENT DOCUMENTS

| | | | |
|---|---|---|---|
| 2,760,173 | 8/1956 | Cunningham | 339/76 |
| 3,805,212 | 4/1974 | Landman et al. | 339/75 MP |
| 3,899,234 | 8/1975 | Yeager et al. | 339/176 MP |
| 4,026,014 | 5/1977 | Sugimoto et al. | 339/176 MP |
| 4,046,452 | 9/1977 | Cassarly | 339/198 H |
| 4,067,637 | 1/1978 | Narozny | 339/210 M |

FOREIGN PATENT DOCUMENTS

| | | | |
|---|---|---|---|
| 953521 | 3/1964 | United Kingdom | 339/176 MP |

*Primary Examiner*—Neil Abrams

[57] ABSTRACT

An electrical connector including first and second wire connecting portions extending in the same longitudinal direction from a contact portion and aligned with each other in a lateral direction, the wire connecting portions being spaced apart in the lateral direction and located at different distances in the longitudinal direction from the contact portion so that wires connected to respective wire connecting portions can lead from the connector in the same lateral direction without interfering with each other. The wire connecting portions may be on separate terminals in housing modules adapted to be coupled together so that the respective contact portions of the terminals define an edge connector.

2 Claims, 6 Drawing Figures

FIG.3.
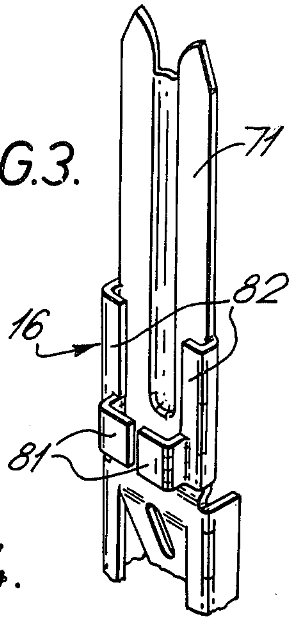
FIG.4.
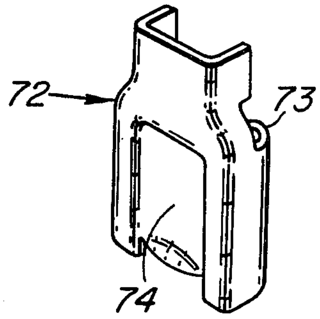
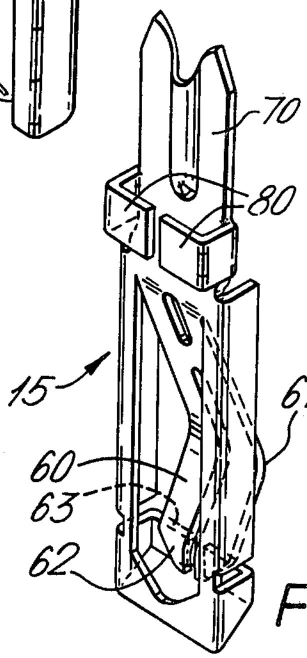
FIG.2.
FIG.1.
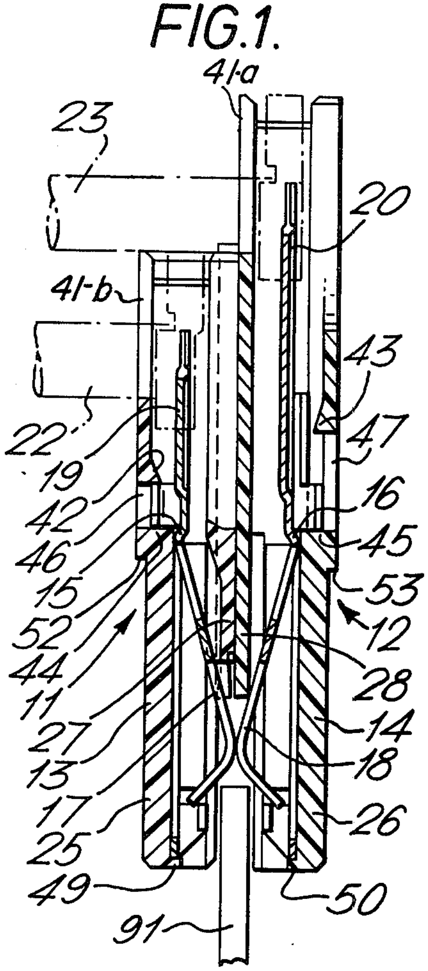

ELECTRICAL CONNECTORS

The invention relates to electrical connectors.

Where space is restricted, for example, in the engine compartment of an automobile, it is sometimes desirable for wires to extend from laterally aligned wire connecting portions of a connector in the same lateral direction without interfering with each other.

According to one aspect of the invention, an electrical connector includes first and second wire connecting portions extending in the same longitudinal direction from a contact portion and aligned with each other in a lateral direction, connecting portions being spaced apart in the lateral direction and located at different distances in the longitudinal direction from the contact portion so that wires connected to respective wire connecting portions can lead from the connector in the same lateral direction without interfering with each other.

When the wire connecting portions are enlarged laterally the longitudinal staggering of the wire connecting portions also enables them to be more closely spaced together facilitating a reduction in the lateral width of the connector.

More specifically, the first and second wire connecting portions extend from first and second contact portions, respectively of separate terminals. The terminals may be mounted in first and second insulating housing modules, respectively, releasably coupled together to form the connector, facilitating moulding of the separate housing modules in one piece. The adaptation may comprise complementary undercut ribs and grooves extending longitudinally of respective housing modules, releasably to couple the housing together.

Desirably, in the assembled connector, the first and second contact portions define between them a female contact for receipt of a tab or printed circuit board.

The first and second terminals and housing modules may be of different lengths to permit the longitudinal staggering of the wire connecting portions with the first and second contact portions located opposite each other to define the female contact.

The longitudinal staggering of the wire connecting portions enables a series of first and second terminals to be mounted in respective rows in first and second housings respectively, with adjacent terminals closely spaced in each row.

Connector assemblies may be adapted to be assembled together in stacked relation with the wire connecting portions longitudinally staggered and the female contacts extending in a common direction for receipt of printed circuit boards arranged parallel in face-to-face relation.

The longitudinal staggering of the wire connecting portions facilitates high contact density along the edges of the printed circuit boards and close spacing of the printed circuit boards which is particularly desirable where the printed circuit boards form the connection matrix of a junction box for an automobile where space is restricted. The staggering also enables individual connector assemblies to be connected sequentially to the printed circuit boards after connection to wires.

The wire connecting portions may have the general form described in U.S. Pat. No. 4,053,197. The terminals may each be formed with a pair of transverse spring locking arms one edge of each arm being engageable behind a ramp surface formed in the housing module to lock the terminal in the housing module, the opposite edges of the arms being engageable with a shoulder formed in the housing to provide a counter abutment to wire connection forces.

The ramp surface and shoulder may be formed on opposite edges of a release aperture provided in the housing module wall to permit release of the locking arms.

According to another aspect of the invention, an electrical connector comprises first and second insulating housing modules in which are mounted first and second terminals respectively, the housing modules being adapted to be coupled together so that first and second contact portions of the first and second terminals, respectively, together define a female contact.

The invention includes an insulating housing module per se.

Examples of the invention will now be described with reference to the accompanying drawings in which:

FIG. 1 is a cross-sectional view of an electrical connector assembly;

FIG. 2 is a perspective view of a first terminal of the connector assembly;

FIG. 3 is a fragmentary perspective view of a second terminal of the connector assembly;

FIG. 4 is a perspective view of a receptacle for engagement with wire connecting portions of the first and second terminals;

Figure 5:
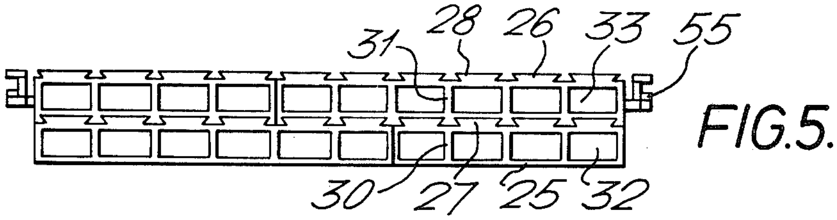
FIG. 5 is a schematic front elevation of a connector assembly housing.
Figure 6:
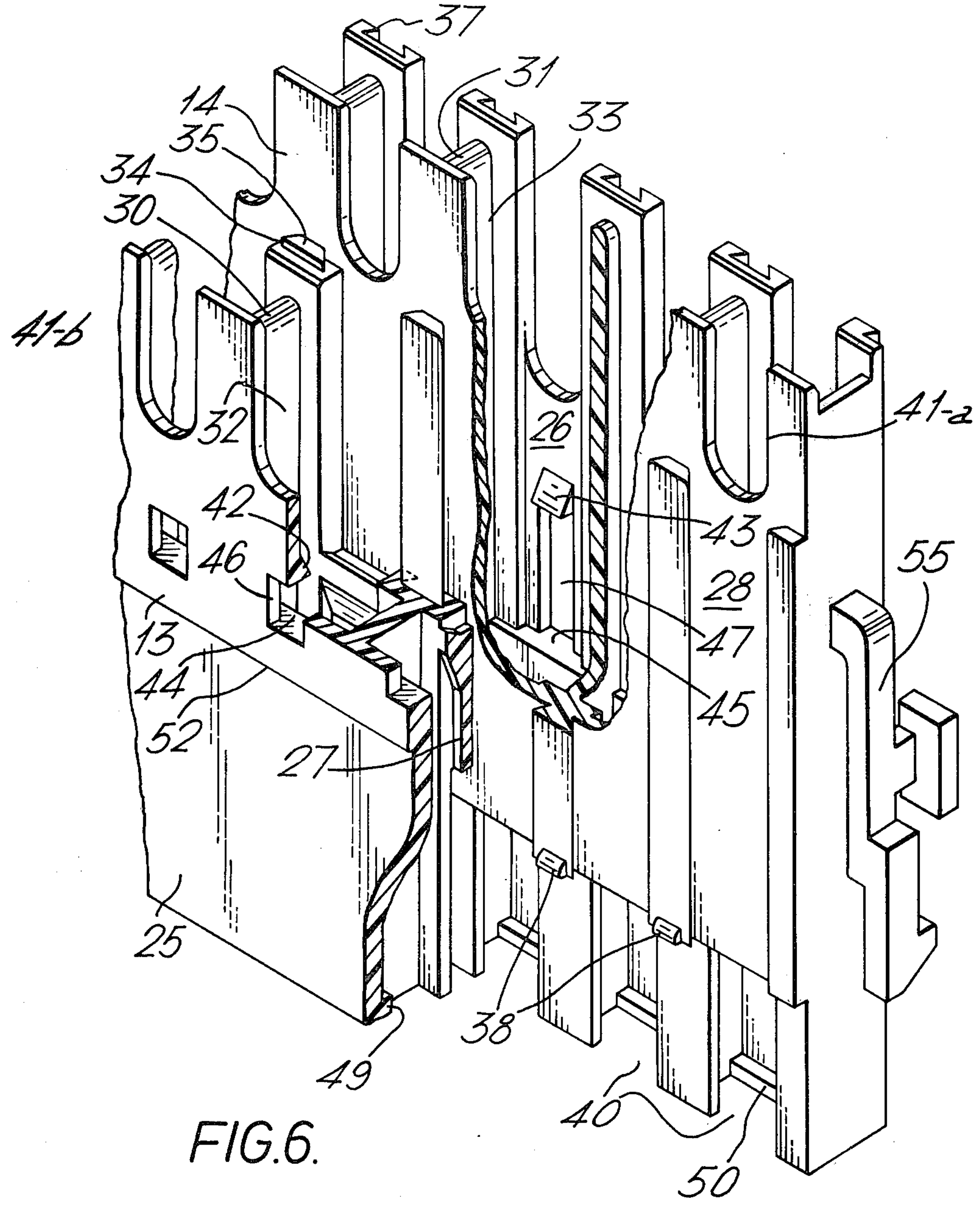
FIG. 6 is a fragmentary perspective view of a connector housing assembly, partly in cross-section.

The connector assembly comprises first and second connector modules 11 and 12 respectively, comprising multiway insulating housing modules 13 and 14 in which are mounted rows of first and second terminals 15 and 16, respectively. The housing modules are releasably coupled together in back-to-back relation so that contact portions 17 and 18 of respective terminals define together a female contact and respective wire connecting portions 19 and 20 are longitudinally staggered to permit lead out of wires 22,23 connected to respective wire connecting portions, from the connector in the same lateral direction without interfering with each other.

The housing modules are each moulded in one piece from plastics material and comprise front and rear walls 25 and 26; 27 and 28, respectively, located in spaced parallel relation by a first and second series of transverse partitions 30 and 31 to define first and second rows of through-passageways 32,33 in which the terminals are mounted.

Longitudinally extending grooves and ribs 34 and 35 of dovetail section are formed on the rear walls at locations behind partitions and couple the housing modules together. Similar grooves 37 may be provided on the front wall 26 of the second module to permit coupling to a third module. Latching detents 38 are formed at the ends of the ribs.

The rear walls 27 and 28 are of reduced length at a contact end of the housing modules to provide contact receiving apertures 40 communicating with each through passageway.

The rear wall of the second module and the first wall of the first module have wire lead out apertures 41-*a* and 41-*b* respectively aligned but longitudinally offset.

The front walls of the housing modules are respectively formed with latching ramps 42 and 43 and shoulders 44 and 45 on opposite sides of terminal release apertures 46 and 47. Ledges 49 and 50, providing terminal stops, are formed at respective front walls of the housings adjacent the contact end. External shoulders 52 and 53 are formed on respective front housings to provide seats for nesting of the connector assembly with similar connector assemblies.

Latches 55 for coupling with junction box housings may be moulded on opposite end walls of one housing module.

The first and second terminals are each stamped and formed from a single piece of sheet metal stock with contact portions 17 and 18 respectively, from which extend longitudinally respective wire connecting portions 19 and 20. The contact portions are each of generally channel-shaped cross-section, a pair of spring legs 60, being struck out from the channel base with intermediate curved contact surface parts 61 protruding beyond the side walls and feet 62 returned behind extensions 63 of the upper edges of the side walls bent over parallel to the channel base.

The first and second wire connecting portions 19 and 20 respectively comprise short and long tabs 70 and 71 free ends of which are adapted to receive sockets 72 of the type shown in FIG. 4 for connection to wires by the method described in U.S. Pat. No. 4,053,197. Such sockets comprise a pair of spring arms 73 rolled over from opposite edges of a web 74 and adapted to receive the tab, between them to strip and grip an insulated wire.

Located intermediate the wire connecting portions and contact portions of the first and second terminals are L-shaped latching arms 80 and 81, respectively. In the first terminals, the arms are bent from opposite edges of the tab web and in the second terminal, the arms 81 are bent from free ends of L-shape extensions 82, themselves bent from opposite edges of the tab web.

To mount the individual terminals in the housing modules, the terminals are pushed contact portion first into the respective through passageways via the wire connecting ends of the housing modules. The free ends of the latching arms ride (with deflection) over ramps 42 and 43 and resile into apertures 46 and 47 and the leading ends of the contact portion abut ledges 49 and 50. Curved portions 61 of contact legs 60 now protrude through aperture 40.

Wires are then connected to respective terminals by the above-mentioned method, the shoulders 44,45 providing counter abutments for the forces produced during connection.

The first and second connector modules are then coupled together in back-to-back relation by engagement of the ribs and grooves until the detents 38 on the second housing module snape behind the first module. The contact portions 17 and 18 are then opposite each other to define a female contact to receive and make separate connection to opposite sides of a printed circuit board 91. The wire connecting portions 19 and 20 are suitably longitudinally offset.

Several modules can be nested together to connect to edges of printed circuit boards arranged parallel in face-to-face relation, the staggering of the wire connecting portions enabling lead out of the wires in the same lateral direction without mutual interference. The releasably coupling of the housing modules and the latching arrangement of individual terminals permits access to and replacement of an individual terminal where necessary.

The individual modules of various lengths may be coupled together as shown in FIG. 5, a larger module providing additional support for the coupling between two smaller modules.

The connectors are particularly useful in conjunction with the junction box (not shown) described in our currently pending U.S. patent application No. 906,535 filed on May 17, 1978 where one face of the junction box is mounted against a bulkhead of an engine compartment in a vehicle and all wires to the connectors must lead out in the same direction away from the bulkhead.

What is claimed is:

1. An electrical connector for interconnecting wires to a printed circuit board, which comprises:

a. a first terminal of conductive material having at one end a contact portion with an intermediate curved contact surface projecting laterally outwardly and a relatively short wire connecting portion extending axially at the other end;

b. a second terminal of conductive material having at one end a contact portion with an intermediate curved contact surface projecting laterally outwardly and a relatively long wire connecting portion extending axially at the other end; and c. first and second housing modules, releasably coupled together in back to back fashion, each module having a passageway in which the first and second terminals are respectively positioned, an aperture being located in the back walls at one end through which the terminals' intermediate curved contact surfaces project to provide in combination, a receptacle for a tab or printed circuit board, and further, wire lead out apertures in the front wall of the first module and the back wall of the second module intersecting the passageways in registration with the respective terminal's wire connecting portions, said aperture in the first module being displaced longitudinally so that the wires which may be connected to the wire connecting portions lead away from the modules in the same lateral direction without interferring with each other.

2. The electrical connector of claim 1 wherein a ramp surface projects into the passageways and the terminals are formed with a pair of transverse spring locking arms one edge of each arm being engageable below the ramp surface to retain the terminals in the passageway.

* * * * *